United States Patent
Wang et al.

(10) Patent No.: US 8,546,275 B2
(45) Date of Patent: *Oct. 1, 2013

(54) ATOMIC LAYER DEPOSITION OF HAFNIUM AND ZIRCONIUM OXIDES FOR MEMORY APPLICATIONS

(75) Inventors: Yun Wang, San Jose, CA (US); Vidyut Gopal, Sunnyvale, CA (US); Imran Hashim, Saratoga, CA (US); Dipankar Pramanik, Saratoga, CA (US); Tony Chiang, Campbell, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/236,481

(22) Filed: Sep. 19, 2011

(65) Prior Publication Data
US 2013/0071984 A1 Mar. 21, 2013

(51) Int. Cl.
*H01L 21/31* (2006.01)
*H01L 21/469* (2006.01)

(52) U.S. Cl.
USPC ...... 438/785; 438/104; 438/384; 257/E21.68; 257/E21.159; 257/E21.175; 365/148

(58) Field of Classification Search
USPC ............... 438/104, 384, 785; 257/E21.68, 257/E21.159, E21.175; 365/148
See application file for complete search history.

(56) References Cited

U.S. PATENT DOCUMENTS

| | | | |
|---|---|---|---|
| 8,288,297 B1 * | 10/2012 | Wang et al. | 438/785 |
| 2006/0033978 A1 * | 2/2006 | Morin et al. | 359/265 |
| 2009/0303780 A1 * | 12/2009 | Kasko et al. | 365/163 |
| 2011/0227020 A1 * | 9/2011 | Sekar et al. | 257/2 |
| 2011/0227024 A1 * | 9/2011 | Sekar et al. | 257/4 |
| 2011/0227028 A1 * | 9/2011 | Sekar et al. | 257/4 |

* cited by examiner

Primary Examiner — Telly Green

(57) ABSTRACT

Embodiments of the invention generally relate to nonvolatile memory devices and methods for manufacturing such memory devices. The methods for forming improved memory devices, such as a ReRAM cells, provide optimized, atomic layer deposition (ALD) processes for forming a metal oxide film stack having a metal oxide buffer layer disposed on or over a metal oxide bulk layer. The metal oxide bulk layer contains a metal-rich oxide material and the metal oxide buffer layer contains a metal-poor oxide material. The metal oxide bulk layer is less electrically resistive than the metal oxide buffer layer since the metal oxide bulk layer is less oxidized or more metallic than the metal oxide buffer layer. In one example, the metal oxide bulk layer contains a metal-rich hafnium oxide material and the metal oxide buffer layer contains a metal-poor zirconium oxide material.

20 Claims, 3 Drawing Sheets

ATOMIC LAYER DEPOSITION OF HAFNIUM AND ZIRCONIUM OXIDES FOR MEMORY APPLICATIONS

BACKGROUND OF THE INVENTION

1. Field of the Invention

Embodiments of the invention generally relate to memory devices and methods for manufacturing such memory devices.

2. Description of the Related Art

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, the resistance of these films and the ratio of the high-to-low resistance states are often insufficient to be of use within a practical nonvolatile memory device. For instance, the resistance states of the metal oxide film should preferably be significant as compared to that of the system (e.g., the memory device and associated circuitry) so that any change in the resistance state change is perceptible. The variation of the difference in resistive states is related to the resistance of the resistive switching layer. Therefore, a low resistance metal oxide film may not form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. Therefore, the state of the bistable metal oxide resistive switching element may be difficult or impossible to sense.

Similar issues can arise from integration of the resistive switching memory element with current steering elements, such as diodes and/or resistors. The resistance of the resistive switching memory element (at least in its high resistance state) is preferably significant compared to the resistance of the current steering elements, so that the unvarying resistance of the current steering element does not dominate the resistance of the switching memory element, and thus reduce the measurable difference between the "on" and "off" states of the formed memory device (e.g., logic states of the device). However, since the power that can be delivered to a circuit containing a series of resistive switching memory elements and current steering elements is typically limited in most conventional nonvolatile memory devices (e.g., CMOS driven devices), it is desirable to form each of the resistive switching memory elements and current steering elements in the circuit so that the voltage drop across each of these elements is small, and thus resistance of the series connected elements does not cause the current to decrease to an undesirable level due to the fixed applied voltage (e.g., about 2-5 volts).

As nonvolatile memory device sizes shrink, it is important to reduce the required currents and voltages that are necessary to reliably set, reset and/or determine the desired "on" and "off" states of the device to minimize resistive heating of the device and cross-talk between adjacent devices. Moreover, in cases where multiple formed memory devices are interconnected to each other and to other circuit elements it is desirable to minimize the device performance variation between one device to the next to assure that the performance of the formed circuit performs in a desirable manner.

Current ReRAM structures use thin film stacks of insulator materials, such as metal oxides (e.g., hafnium oxide) between metal electrodes to form a device that can be switched between two different stable resistance states by the application of appropriate voltages. In one class of cells, specifically bipolar ReRAMs, the switching is enabled by the back and forth movement of charged oxygen vacancies between the electrodes under the influence of the applied electrical field. In order for the cell to be able to switch reproducibly for many thousands of cycles, it is necessary that there always be a sufficient concentration of vacancies in the bulk of the metal oxide film. The interface between the electrode and the metal oxide bulk film is a region in which vacancies may be trapped and eventually be removed from the metal oxide bulk film. This is especially true when reactive metal surfaces or boundary regions have large structural changes relative to the metal oxide bulk film.

Therefore, there is a need for an effective interface that is separate from the electrode interface but does not substantially alter the switching properties of the metal oxide bulk film, as well as a need for an efficient and controllable process to form such metal oxide bulk film for a nonvolatile memory device.

SUMMARY OF THE INVENTION

Embodiments of the invention generally relate to nonvolatile memory devices and methods for manufacturing such memory devices. The methods for forming improved memory devices, such as a ReRAM cells, provide optimized, atomic layer deposition (ALD) processes for forming a metal oxide film stack which contains a metal oxide buffer layer (e.g., metal-poor oxide, such that the metal is completely oxidized or substantially oxidized) disposed on or over a metal oxide bulk layer (e.g., metal-rich oxide, such that the metal is less oxidized than the metal-poor oxide). Therefore, the metal oxide bulk layer containing a metal-rich oxide material is less electrically resistive than the metal oxide buffer layer containing a metal-poor oxide material since the metal oxide bulk layer is less oxidized or more metallic than the metal oxide buffer layer. In one example, the metal oxide bulk layer contains a metal-rich hafnium oxide material and the metal oxide buffer layer contains a metal-poor zirconium oxide material. In another example, the metal oxide bulk layer contains a metal-rich zirconium oxide material and the metal oxide buffer layer contains a metal-poor hafnium oxide material.

The described ALD processes are techniques for depositing ultra-thin metal oxide films due to practical advantages which includes simple and accurate thickness control, excellent reproducibility and uniformity, and capability to produce conformal films at sharp interfaces and trenches with high aspect ratio. By optimizing the ratio of metal precursor gas to oxidizer pulses, metal oxide materials can be made metal-rich or metal-poor (metal deficient), which in turn tailors the oxygen defect content and type (vacancy vs. interstitial), resulting in an enhancement or reduction in defect density to facilitate carrier transport.

In many embodiments, a method for fabricating a resistive switching memory element, such as a memory device, is provided and includes forming a metal oxide film stack on or over a lower electrode disposed on a substrate, wherein the metal oxide film stack contains a metal oxide buffer layer disposed on or over a metal oxide bulk layer. In some embodiments of the method, the metal oxide film stack may be formed by depositing the metal oxide bulk layer over the lower electrode during a first ALD process, wherein the metal oxide bulk layer substantially contains $MO_x$, where M is hafnium or zirconium and x is within a range from about 1.65 to about 1.95. The method further provides depositing the metal oxide buffer layer over the metal oxide bulk layer during a second ALD process, wherein the metal oxide buffer layer substantially contains $M'O_2$, where M' is zirconium if M is hafnium or M' is hafnium if M is zirconium.

In some examples described herein, the metal oxide bulk layer substantially contains a metal-rich hafnium oxide which has the chemical formula of $HfO_x$, where x is within a range from about 1.70 to about 1.90, and the metal oxide buffer layer substantially contains a metal-poor, zirconium oxide material having the chemical formula of $ZrO_2$. In other examples described herein, the metal oxide bulk layer substantially contains a metal-rich zirconium oxide which has the chemical formula of $ZrO_x$, where x is within a range from about 1.70 to about 1.90, and the metal oxide buffer layer substantially contains a metal-poor, hafnium oxide material which has the chemical formula of $HfO_2$. In additional examples, the metal oxide bulk layer contains a metal-rich oxide material which has the chemical formula of $HfO_x$ or $ZrO_x$, where x is within a range from about 1.65 to about 1.95, such as from about 1.70 to about 1.90, such as from about 1.75 to about 1.85, for example, about 1.80. The metal oxide bulk layer may have a thickness within a range from about 5 Å to about 100 Å, such as from about 10 Å to about 80 Å, such as from about 15 Å to about 50 Å. The metal oxide buffer layer may have a thickness within a range from about 2 Å to about 80 Å, such as from about 5 Å to about 50 Å, such as from about 5 Å to about 15 Å.

In other embodiments, the first ALD process includes sequentially providing a metal source gas and an oxidizing agent during a metal-rich oxidizing ALD process. In some examples, the metal source gas may contain a tetrakis(dialkylamido) hafnium compound and the oxidizing agent may contain water during the metal-rich oxidizing ALD process. For example, the tetrakis(dialkylamido) hafnium compound may be tetrakis(dimethylamido) hafnium. In other examples, the metal source gas may contain a tetrakis(dialkylamido) zirconium compound and the oxidizing agent may contain water during the metal-rich oxidizing ALD process. For example, the tetrakis(dialkylamido) zirconium compound may be tetrakis(dimethylamido) zirconium. In one embodiment described herein, the substrate may be maintained at a deposition temperature or a substrate temperature within a range from greater than 0° C. to about 20° C., such as from greater than 0° C. to about 15° C., such as from greater than 0° C. to about 10° C., such as from greater than 0° C. to about 5° C., for example about 1° C. during the metal-rich oxidizing ALD process.

In other embodiments, the second ALD process includes sequentially providing a metal source gas and an oxidizing agent during a metal-poor oxidizing ALD process. In some examples, the metal source gas may contain the tetrakis(dialkylamido) zirconium compound and the oxidizing agent may contain an activated oxygen agent, such as ozone, atomic oxygen, oxygen plasma, derivatives thereof, or combinations thereof during the metal-poor oxidizing ALD process. In other examples, the metal source gas may contain the tetrakis(dialkylamido) hafnium compound and the oxidizing agent may contain the activated oxygen agent during the metal-poor oxidizing ALD process.

In some embodiments, the method further provides forming a silicon oxide layer on or over the lower electrode, and subsequently, forming the metal oxide bulk layer on or over the silicon oxide layer. The silicon oxide layer contains a silicon oxide material, such as native silicon oxides, silicon dioxide, dopant variants thereof, or combinations thereof. The silicon oxide layer may have a thickness within a range from about 2 Å to about 40 Å, such as from about 2 Å to about 20 Å, such as from about 5 Å to about 10 Å.

In another embodiment described herein, a method for fabricating a resistive switching memory element is provided and includes forming a metal oxide film stack on or over a lower electrode disposed on a substrate, wherein the metal oxide film stack may contain a doped-metal oxide buffer layer disposed on or over a metal oxide bulk layer. The method provides that the metal oxide film stack may be formed by depositing the metal oxide bulk layer over the lower electrode during a first ALD process, wherein the metal oxide bulk layer substantially contains $MO_x$, where M is hafnium or zirconium and x is within a range from about 1.65 to about 1.95. The method includes depositing the doped-metal oxide buffer layer over the metal oxide bulk layer during a second ALD process, wherein the doped-metal oxide buffer layer substantially contains $MM'O_4$ or a mixture of $MO_2$ and $M'O_2$, where M is the same metal selected for the metal oxide bulk layer, M' is zirconium if M is hafnium or M' is hafnium if M is zirconium.

In many examples, the doped-metal oxide buffer layer substantially contains a mixture of $MO_2$ and $M'O_2$, wherein M is hafnium and M' is zirconium. The doped-metal oxide buffer layer may contain zirconium oxide at a concentration within a range from about 0.25 at % (atomic percent) to about 25 at % and hafnium oxide at a concentration within a range from about 75 at % to about 99.75 at %. In some examples, the doped-metal oxide buffer layer may contain zirconium oxide at a concentration within a range from about 0.5 at % to about 20 at % and hafnium oxide at a concentration within a range from about 80 at % to about 99.5 at %. In other examples, the doped-metal oxide buffer layer may contain zirconium oxide at a concentration within a range from about 1 at % to about 15 at % and hafnium oxide at a concentration within a range from about 85 at % to about 99 at %.

In other examples, the doped-metal oxide buffer layer substantially contains a mixture of $MO_2$ and $M'O_2$, wherein M is zirconium and M' is hafnium. The doped-metal oxide buffer layer may contain hafnium oxide at a concentration within a range from about 0.25 at % to about 25 at % and zirconium oxide at a concentration within a range from about 75 at % to about 99.75 at %. In some examples, the doped-metal oxide buffer layer may contain hafnium oxide at a concentration within a range from about 0.5 at % to about 20 at % and zirconium oxide at a concentration within a range from about 80 at % to about 99.5 at %. In other examples, the doped-metal oxide buffer layer may contain hafnium oxide at a concentration within a range from about 1 at % to about 15 at % and zirconium oxide at a concentration within a range from about 85 at % to about 99 at %.

In some embodiments, the doped-metal oxide buffer layer may have a thickness within a range from about 2 Å to about 80 Å, such as from about 5 Å to about 50 Å, such as from about 5 Å to about 30 Å. The metal oxide bulk layer may have a thickness within a range from about 5 Å to about 100 Å, such as from about 10 Å to about 80 Å, such as from about 15 Å to about 50 Å.

In another embodiment, the second ALD process further includes sequentially providing a first metal source gas and an oxidizing agent while forming a metal-poor oxide layer during a deposition step of a metal-poor oxidizing ALD process, and subsequently doping the metal-poor oxide layer while forming the doped-metal oxide buffer layer during a doping step of the metal-poor oxidizing ALD process. The method may further include repeating the deposition and doping steps of the metal-poor oxidizing ALD process while forming the doped-metal oxide buffer layer. The metal-poor oxide layer may be exposed to a second metal source gas and the oxidizing agent during the doping step of the metal-poor oxidizing ALD process.

In another embodiment described herein, a method for fabricating a resistive switching memory element is provided and includes forming a metal oxide film stack on or over a lower electrode disposed on a substrate, wherein the metal oxide film stack contains a metal oxide buffer laminate disposed on or over a metal oxide bulk layer. The method further provides that the metal oxide film stack may be formed by depositing the metal oxide bulk layer over the lower electrode during a first ALD process, wherein the metal oxide bulk layer substantially contains $MO_x$, where M is hafnium or zirconium and x is within a range from about 1.65 to about 1.95. The method also provides depositing the metal oxide buffer laminate over the metal oxide bulk layer during a second ALD process, wherein the metal oxide buffer laminate substantially contains a plurality metal-poor oxide layers of $MO_2$ and $M'O_2$, where M is the same metal selected for the metal oxide bulk layer, M' is zirconium if M is hafnium or M' is hafnium if M is zirconium.

In many examples, the second ALD process further includes sequentially providing a first metal source gas and an oxidizing agent while forming a first metal-poor oxide layer during a first step of a metal-poor oxidizing ALD process, and subsequently, sequentially providing a second metal source gas and the oxidizing agent while forming a second metal-poor oxide layer on the first metal-poor layer during a second step of the metal-poor oxidizing ALD process. The method further provides repeating the first and second steps of the metal-poor oxidizing ALD process while forming a plurality of first and second metal-poor oxide layers contained within the metal oxide buffer laminate. Each of the first and second metal source gases may independently contain an organic-metallic compound. In some examples, the oxidizing agent may contain an activated oxygen agent, such as ozone, atomic oxygen, oxygen plasma, derivatives thereof, or combinations thereof. Each of the metal-poor oxide layers may independently have a thickness within a range from about 2 Å to about 20 Å, such as from about 2 Å to about 10 Å, such as from about 3 Å to about 7 Å, for example, about 5 Å. Also, the metal oxide buffer laminate may have a thickness within a range from about 2 Å to about 80 Å, such as from about 5 Å to about 50 Å, such as from about 5 Å to about 30 Å. The metal oxide bulk layer may have a thickness within a range from about 5 Å to about 100 Å, such as from about 10 Å to about 80 Å, such as from about 15 Å to about 50 Å.

In other embodiments described herein, a method for fabricating a resistive switching memory element is provided and includes forming a metal oxide film stack on or over a lower electrode disposed on a substrate, wherein the metal oxide film stack may contain a metal oxide buffer laminate disposed on or over a metal oxide bulk laminate. The method further includes forming the metal oxide bulk laminate by sequentially providing a first metal source gas and a first oxidizing agent while forming a first metal-rich oxide layer during a first step of a metal-rich oxidizing ALD process, wherein the first metal-rich oxide layer substantially contains $MO_x$, where M is hafnium or zirconium and x is within a range from about 1.65 to about 1.95.

Subsequently, the method further includes sequentially providing a second metal source gas and the first oxidizing agent while forming a second metal-rich oxide layer on the first metal-rich oxide layer during a second step of the metal-rich oxidizing ALD process, wherein the second metal-rich oxide layer substantially contains $M'O_2$, where M' is zirconium if M is hafnium or M' is hafnium if M is zirconium. Thereafter, the method further includes repeating the first and second steps of the metal-rich ALD process while forming a plurality of the first and second metal-rich oxide layers contained within the metal oxide bulk laminate.

Additionally, the method further includes forming the metal oxide bulk laminate by sequentially providing the first metal source gas and a second oxidizing agent while forming a first metal-poor oxide layer during a first step of a metal-poor oxidizing ALD process, wherein the first metal-poor oxide layer substantially contains $MO_x$, where M is hafnium or zirconium and x is within a range from about 1.65 to about 1.95. Subsequently, the method further includes sequentially providing the second metal source gas and the second oxidizing agent while forming a second metal-poor oxide layer on the first metal-poor oxide layer during a second step of the metal-poor oxidizing ALD process, wherein the second metal-poor oxide layer substantially contains $M'O_2$, where M' is zirconium if M is hafnium or M' is hafnium if M is zirconium. Thereafter, the method further includes repeating the first and second steps of the metal-poor oxidizing ALD process while forming a plurality of the first and second metal-poor oxide layers contained within the metal oxide buffer laminate.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention generally relate to nonvolatile memory devices and methods for manufacturing such memory devices. The invention teaches a novel process to form a metal oxide film stacks for an improved ReRAM cell. The metal oxide film stacks contains a metal oxide buffer layer disposed on or over a metal oxide bulk layer, such that the metal in both metal oxide layers are different metals (e.g., Hf vs Zr) and have different states of oxidation, such as metal-rich and metal-poor oxide materials. The metal oxide bulk layer and the metal oxide buffer layer are formed by different ALD processes. In one example, the metal oxide bulk layer contains a metal-rich hafnium oxide material and the metal oxide buffer layer contains a metal-poor zirconium oxide material. In another example, the metal oxide bulk layer contains a metal-rich zirconium oxide material and the metal oxide buffer layer contains a metal-poor hafnium oxide material.

Figure 1:
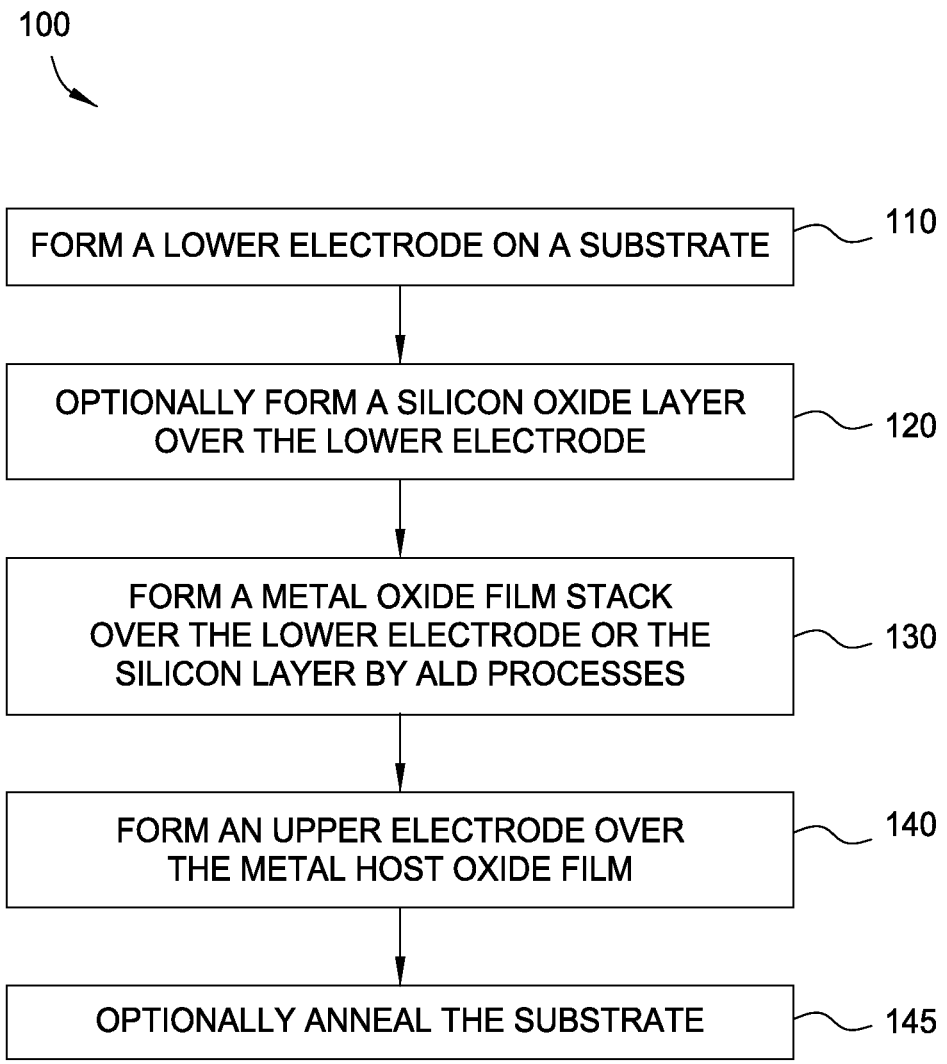
FIG. 1 is a flowchart illustrating a method to form a memory device, as described by embodiments herein.
Figure 2A:
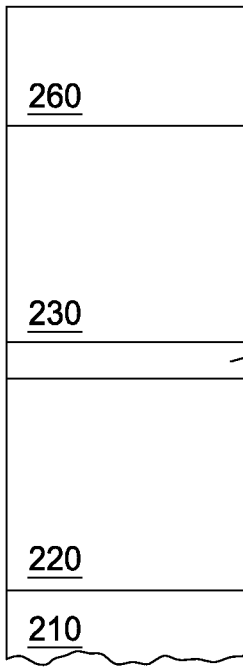
FIG. 2A depicts a memory device which may be formed by a method illustrated in FIG. 1, as described by embodiments herein.

FIG. 1 is a flowchart illustrating a method for manufacturing or otherwise forming various memory devices, as described by embodiments herein, such as process 100 which may be utilized to form resistive switching memory elements/devices, such as memory device 200, as depicted in FIG. 2A. In one embodiment, process 100 may be used to form memory device 200 and includes forming lower electrode 220 on or over substrate 210 during step 110, optionally forming silicon oxide layer 222 on or over lower electrode 220 during step 120, forming metal oxide film stack 230 on or over silicon oxide layer 222 or lower electrode 220 by ALD processes during step 130, depositing upper electrode 260 on or over metal oxide film stack 230 during step 140, and optionally annealing memory device 200 during step 145. FIGS. 2B-2E depict a variety of metal oxide film stacks 230 formed by different ALD techniques during step 130, as described by embodiments herein.

In many embodiments, a variety of metal oxide film stacks 230, as depicted in FIGS. 2B-2E, may be formed by different ALD techniques during step 130 of process 100, and contained within memory device 200 depicted in FIG. 2A. Each of the metal oxide film stacks 230 depicted in FIGS. 2B-2E may be disposed between lower electrode 220 and upper electrode 260 of memory device 200. Therefore, any of the particular lower layers depicted in each of the metal oxide film stacks 230 may be on or over lower electrode 220. Similarly, upper electrode 260 may be on or over any of the particular upper layers depicted in each of the metal oxide film stacks 230. Silicon oxide layer 222 may be deposited, formed, or otherwise disposed on or over lower electrode 220.

Figure 2B:
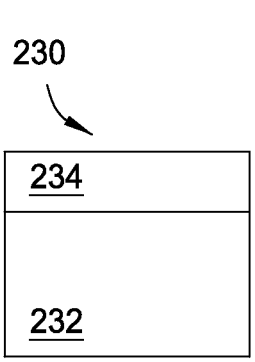
FIGS. 2B-2E depict various metal oxide film stacks which may be formed within the memory device illustrated in FIG. 2A, as described by other embodiments herein.

In one embodiment, metal oxide film stack 230 contains metal oxide buffer layer 234 disposed on or over metal oxide bulk layer 232, as depicted in FIG. 2B. Metal oxide bulk layer 232 may substantially contain a metal-rich oxide material having a generic chemical formula of $MO_x$, where M is hafnium or zirconium and x is within a range from about 1.65 to about 1.95. Also, metal oxide buffer layer 234 substantially contains a metal-poor oxide material having a generic chemical formula of $M'O_2$, where M' is zirconium if M is hafnium or M' is hafnium if M is zirconium.

Figure 2C:
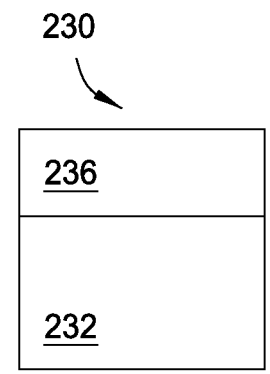

In another embodiment, metal oxide film stack 230 contains doped-metal oxide buffer layer 236 disposed on or over metal oxide bulk layer 232, as depicted in FIG. 2C. Doped-metal oxide buffer layer 236 substantially contains $MM'O_4$ or a mixture of $MO_2$ and $M'O_2$, where M is the same metal selected for metal oxide bulk layer 232, M' is zirconium if M is hafnium or M' is hafnium if M is zirconium.

Figure 2D:
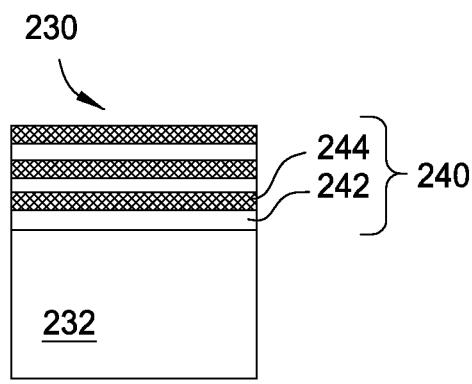

In another embodiment, metal oxide film stack 230 contains metal oxide buffer laminate 240 disposed on or over metal oxide bulk layer 232, as depicted in FIG. 2D. Metal oxide buffer laminate 240 may substantially contain a plurality metal-poor oxide layers of $MO_2$ and $M'O_2$, such as metal-poor oxide layers 242 and 244, where M is the same metal selected for metal oxide bulk layer 232, M' is zirconium if M is hafnium or M' is hafnium if M is zirconium.

Figure 2E:
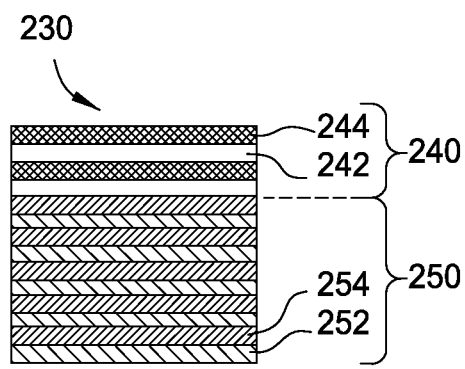

In another embodiment, metal oxide film stack 230 contains metal oxide buffer laminate 240 disposed on or over metal oxide bulk laminate 250, as depicted in FIG. 2E. A plurality of metal-rich oxide layers 252 and 254 are contained within metal oxide bulk laminate 250. Metal-rich oxide layer 252 may substantially contain $MO_x$, where M is hafnium or zirconium and x is within a range from about 1.65 to about 1.95, while metal-rich oxide layer 254 may substantially contain $M'O_2$, where M' is zirconium if M is hafnium or M' is hafnium if M is zirconium.

In various embodiments, process 100 further provides step 120 which includes optionally forming silicon oxide layer 222 on or over lower electrode 220, and subsequently, forming metal oxide bulk layer 232 on or over silicon oxide layer 222, as depicted in FIGS. 2B-2E. Silicon oxide layer 222 contains a silicon oxide material, such as native silicon oxides, silicon dioxide, dopant variants thereof, or combinations thereof. Silicon oxide layer 222 may contain a single layer or multiple layers of the same or different silicon oxide materials. Usually, silicon oxide layer 222 may be continuously formed, deposited, or otherwise disposed on or over lower electrode 220 or other underlying surfaces. Alternatively, silicon oxide layer 222 may also be discontinuously formed, deposited, or otherwise disposed on or over lower electrode 220 or other underlying surfaces. Silicon oxide layer 222 may have a thickness within a range from about 2 Å to about 40 Å, such as from about 2 Å to about 20 Å, such as from about 5 Å to about 10 Å.

In many embodiments, a method for fabricating a resistive switching memory device or element, such as memory device 200, is provided and includes forming metal oxide film stack 230 on or over silicon oxide layer 222 or lower electrode 220 disposed on substrate 210, wherein metal oxide film stack 230 contains metal oxide buffer layer 234 disposed on or over metal oxide bulk layer 232. Metal oxide bulk layer 232 is less electrically resistive than metal oxide buffer layer 234 since metal oxide bulk layer 232 is less oxidized or more metallic than metal oxide buffer layer 234. Therefore, metal oxide bulk layer 232 is metal-rich and more leaky relative to metal oxide buffer layer 234 which has a metal-poor.

In one embodiment, metal oxide film stack 230 contains metal oxide buffer layer 234 disposed on or over metal oxide bulk layer 232, as depicted in FIG. 2B. Metal oxide film stack 230 may be formed by depositing metal oxide bulk layer 232 over lower electrode 220 during a first ALD process, such as a metal-rich oxidizing ALD process at step 130 of process 100. Metal oxide bulk layer 232 may substantially contain a metal-rich oxide material having a generic chemical formula of $MO_x$, where M is hafnium or zirconium and x is within a range from about 1.65 to about 1.95. Step 130 of process 100 further provides a method which includes depositing metal oxide buffer layer 234 over metal oxide bulk layer 232 during a second ALD process, such as a metal-poor oxidizing ALD process, wherein metal oxide buffer layer 234 may substantially contain a metal-poor oxide material having a generic chemical formula of $M'O_2$, where M' is zirconium if M is hafnium or M' is hafnium if M is zirconium.

In some examples described herein, metal oxide bulk layer 232 may substantially contain a metal-rich, hafnium oxide material having the generic chemical formula of $HfO_x$, where x is within a range from about 1.70 to about 1.90, and metal oxide buffer layer 234 may substantially contain a metal-poor, zirconium oxide material having the generic chemical formula of $ZrO_2$. In other examples described herein, metal oxide bulk layer 232 may substantially contain a metal-rich, zirconium oxide material having the generic chemical formula of $ZrO_x$, where x is within a range from about 1.70 to about 1.90, and metal oxide buffer layer 234 may substantially contain a metal-poor, hafnium oxide material having the generic chemical formula of $HfO_2$. In some additional examples, metal oxide bulk layer 232 substantially contains a metal-rich oxide material having the generic chemical formula of $HfO_x$ or $ZrO_x$, where x is within a range from about 1.65 to about 1.95, such as from about 1.70 to about 1.90, such as from about 1.75 to about 1.85, for example, about 1.80.

Metal oxide bulk layer 232 may have a thickness within a range from about 5 Å to about 100 Å, such as from about 10 Å to about 80 Å, such as from about 15 Å to about 50 Å. Metal oxide buffer layer 234 may have a thickness within a range from about 2 Å to about 80 Å, such as from about 5 Å to about 50 Å, such as from about 5 Å to about 15 Å.

In other embodiments, the first ALD process, such as the metal-rich oxidizing ALD process, includes sequentially providing a metal source gas and an oxidizing agent into the deposition chamber while sequentially exposing the surfaces of the substrate or device to the chemical reagents/precursors. In some examples, the metal source gas may contain a hafnium precursor, such as a tetrakis(dialkylamido) hafnium compound or a hafnium halide compound and the oxidizing agent may contain water during the metal-rich oxidizing ALD process. In one example, the tetrakis(dialkylamido) hafnium compound may be tetrakis(dimethylamido) hafnium or the hafnium halide compound may be hafnium tetrachloride. In other examples, the metal source gas may contain a zirconium precursor, such as a tetrakis(dialkylamido) zirconium compound or a zirconium halide compound and the oxidizing agent may contain water during the metal-rich oxidizing ALD process. For example, the tetrakis(dialkylamido) zirconium compound may be tetrakis(dimethylamido) zirconium or the zirconium halide compound may be zirconium tetrachloride.

In one embodiment described herein, substrate 210 and/or memory device 200 may be maintained at a deposition temperature or a substrate temperature within a range from greater than 0° C. to about 20° C., such as from greater than 0° C. to about 15° C., such as from greater than 0° C. to about 10° C., such as from greater than 0° C. to about 5° C., for example about 1° C. during the metal-rich oxidizing ALD process.

In other embodiments, the second ALD process, such as a metal-poor oxidizing ALD process, includes sequentially providing a metal source gas and an oxidizing agent into the deposition chamber while sequentially exposing the surfaces of the substrate or device to the chemical reagents/precursors. In some examples, the metal source gas may contain the tetrakis(dialkylamido) zirconium compound or the zirconium halide compound and the oxidizing agent may contain an activated oxygen agent, such as ozone, atomic oxygen, oxygen plasma, derivatives thereof, or combinations thereof during the metal-poor oxidizing ALD process. In other examples, the metal source gas may contain the tetrakis(dialkylamido) hafnium compound and the oxidizing agent may contain the activated oxygen agent during the metal-poor oxidizing ALD process.

In another embodiment, metal oxide film stack 230 contains doped-metal oxide buffer layer 236 disposed on or over metal oxide bulk layer 232, as depicted in FIG. 2C. Doped-metal oxide buffer layer 236 substantially contains $MM'O_4$ or a mixture of $MO_2$ and $M'O_2$, where M is the same metal selected for metal oxide bulk layer 232, M' is zirconium if M is hafnium or M' is hafnium if M is zirconium.

In another embodiment described herein, a method for fabricating a resistive switching memory device or element, such as memory device 200, is provided and includes forming metal oxide film stack 230 at step 130 of process 100 on or over lower electrode 220 disposed on substrate 210, wherein metal oxide film stack 230 may contain doped-metal oxide buffer layer 236 disposed on or over metal oxide bulk layer 232, as depicted in FIG. 2C. The method provides that metal oxide film stack 230 may be formed by depositing metal oxide bulk layer 232 over lower electrode 220 during a first ALD process, such as a metal-rich oxidizing ALD process at step 130 of process 100.

Metal oxide bulk layer 232 may substantially contain $MO_x$, where M is hafnium or zirconium and x is within a range from about 1.65 to about 1.95. The method includes depositing doped-metal oxide buffer layer 236 over metal oxide bulk layer 232 during a second ALD process, wherein doped-metal oxide buffer layer 236 may substantially contain $MM'O_4$ or a mixture of $MO_2$ and $M'O_2$, where M is the same metal selected for metal oxide bulk layer 232, M' is zirconium if M is hafnium or M' is hafnium if M is zirconium.

In many examples, doped-metal oxide buffer layer 236 may substantially contain a mixture of $MO_2$ and $M'O_2$, wherein M is hafnium and M' is zirconium. Doped-metal oxide buffer layer 236 may contain zirconium oxide at a concentration within a range from about 0.25 at % (atomic percent) to about 25 at % and hafnium oxide at a concentration within a range from about 75 at % to about 99.75 at %. In some examples, doped-metal oxide buffer layer 236 may contain zirconium oxide at a concentration within a range from about 0.5 at % to about 20 at % and hafnium oxide at a concentration within a range from about 80 at % to about 99.5 at %. In other examples, doped-metal oxide buffer layer 236 may contain zirconium oxide at a concentration within a range from about 1 at % to about 15 at % and hafnium oxide at a concentration within a range from about 85 at % to about 99 at %.

In other examples, doped-metal oxide buffer layer 236 may substantially contain a mixture of $MO_2$ and $M'O_2$, wherein M is zirconium and M' is hafnium. Doped-metal oxide buffer layer 236 may contain hafnium oxide at a concentration within a range from about 0.25 at % to about 25 at % and zirconium oxide at a concentration within a range from about 75 at % to about 99.75 at %. In some examples, doped-metal oxide buffer layer 236 may contain hafnium oxide at a concentration within a range from about 0.5 at % to about 20 at % and zirconium oxide at a concentration within a range from about 80 at % to about 99.5 at %. In other examples, doped-metal oxide buffer layer 236 may contain hafnium oxide at a concentration within a range from about 1 at % to about 15 at % and zirconium oxide at a concentration within a range from about 85 at % to about 99 at %. In some embodiments, doped-metal oxide buffer layer 236 may have a thickness within a range from about 2 Å to about 80 Å, such as from about 5 Å to about 50 Å, such as from about 5 Å to about 30 Å. Metal oxide bulk layer 232 may have a thickness within a range from about 5 Å to about 100 Å, such as from about 10 Å to about 80 Å, such as from about 15 Å to about 50 Å.

In another embodiment, the second ALD process further includes sequentially providing a first metal source gas and an oxidizing agent while forming a metal-poor oxide layer during a deposition step of a metal-poor oxidizing ALD process, and subsequently doping the metal-poor oxide layer while forming doped-metal oxide buffer layer 236 during a doping step of the metal-poor oxidizing ALD process. The method may further include repeating the deposition and doping steps of the metal-poor oxidizing ALD process while forming doped-metal oxide buffer layer 236. The metal-poor oxide layer may be exposed to a second metal source gas and the oxidizing agent during the doping step of the metal-poor oxidizing ALD process.

In another embodiment, metal oxide film stack 230 contains metal oxide buffer laminate 240 disposed on or over metal oxide bulk layer 232, as depicted in FIG. 2D. Metal oxide buffer laminate 240 may substantially contain a plurality metal-poor oxide layers of $MO_2$ and $M'O_2$, such as metal-poor oxide layers 242 and 244, where M is the same metal selected for metal oxide bulk layer 232, M' is zirconium if M is hafnium or M' is hafnium if M is zirconium.

In another embodiment described herein, a method for fabricating a resistive switching memory device or element, such as memory device 200, is provided and includes forming metal oxide film stack 230 at step 130 of process 100 on or over lower electrode 220 disposed on substrate 210, wherein metal oxide film stack 230 contains metal oxide buffer laminate 240 disposed on or over metal oxide bulk layer 232. Process 100 further provides a method for forming metal oxide film stack 230 by depositing metal oxide bulk layer 232 over lower electrode 220 during a first ALD process, wherein metal oxide bulk layer 232 may substantially contain $MO_x$, where M is hafnium or zirconium and x is within a range from about 1.65 to about 1.95. The methods of process 100 also provides depositing metal oxide buffer laminate 240 on or over metal oxide bulk layer 232 during a second ALD process, wherein metal oxide buffer laminate 240 may substantially contain a plurality metal-poor oxide layers of $MO_2$ and $M'O_2$, such as metal-poor oxide layers 242 and 244, where M is the same metal selected for metal oxide bulk layer 232, M' is zirconium if M is hafnium or M' is hafnium if M is zirconium.

In many examples, the second ALD process further includes sequentially providing a first metal source gas and an oxidizing agent while forming a first metal-poor oxide layer, such as metal-poor oxide layer 242, during a first step of a metal-poor oxidizing ALD process, and subsequently, sequentially providing a second metal source gas and the oxidizing agent while forming a second metal-poor oxide layer, such as metal-poor oxide layer 244, on the first metal-poor layer during a second step of the metal-poor oxidizing ALD process. Process 100 further provides a method which includes repeating the first and second steps of the metal-poor oxidizing ALD process while forming a plurality of metal-poor oxide layers 242 and 244 contained within metal oxide buffer laminate 240. The first metal source gas and the second metal source gas independently contain the respective metal source precursor, such as an organic-metallic compound. In some examples, the oxidizing agent may contain an activated oxygen agent, such as ozone, atomic oxygen, oxygen plasma, derivatives thereof, or combinations thereof.

Metal oxide buffer laminate 240 contains a plurality of sequentially stacked metal-poor oxide layers 242 and 244, such that metal oxide buffer laminate 240 contains at least 2 layers of metal-poor oxide layer 242 sequentially stacked with at least 2 layers of metal-poor oxide layer 244. In some examples, metal oxide buffer laminate 240 contains at least 2 layers of each metal-poor oxide layer 242 and 244, but may contain from 3 layers to about 50 layers or more of each metal-poor oxide layer 242 and 244. Each of the metal-poor oxide layers 242 and 244 may independently have a thickness within a range from about 2 Å to about 20 Å, such as from about 2 Å to about 10 Å, such as from about 3 Å to about 7 Å, for example, about 5 Å. Therefore, metal oxide buffer laminate 240 may have a total final thickness within a range from about 5 Å to about 80 Å, such as from about 5 Å to about 50 Å, such as from about 5 Å to about 30 Å. Generally, metal oxide bulk layer 232 may have a thickness within a range from about 5 Å to about 100 Å, such as from about 10 Å to about 80 Å, such as from about 15 Å to about 50 Å.

In another embodiment, metal oxide film stack 230 contains metal oxide buffer laminate 240 disposed on or over metal oxide bulk laminate 250, as depicted in FIG. 2E. A plurality of metal-rich oxide layers 252 and 254 are contained within metal oxide bulk laminate 250. Metal-rich oxide layer 252 may substantially contain $MO_x$, where M is hafnium or zirconium and x is within a range from about 1.65 to about 1.95, while metal-rich oxide layer 254 may substantially contain $M'O_2$, where M' is zirconium if M is hafnium or M' is hafnium if M is zirconium.

In other embodiments described herein, a method for fabricating a resistive switching memory device or element, such as memory device 200, is provided and includes forming metal oxide film stack 230 at step 130 of process 100 on or over lower electrode 220 disposed on substrate 210, wherein metal oxide film stack 230 contains metal oxide buffer laminate 240 disposed on or over metal oxide bulk laminate 250. The method further includes forming metal oxide bulk laminate 250 by sequentially providing a first metal source gas and a first oxidizing agent while forming a first metal-rich oxide layer, such as metal-rich oxide layer 252, during a first step of a metal-rich oxidizing ALD process, wherein metal-rich oxide layer 252 may substantially contain $MO_x$, where M is hafnium or zirconium and x is within a range from about 1.65 to about 1.95.

Subsequently, during step 130, the method further includes sequentially providing a second metal source gas and the first oxidizing agent while forming a second metal-rich oxide layer, such as metal-rich oxide layer 254, on or over metal-rich oxide layer 252 during a second step of the metal-rich oxidizing ALD process, wherein metal-rich oxide layer 254 may substantially contain $M'O_2$, where M' is zirconium if M is hafnium or M' is hafnium if M is zirconium. Thereafter, the method further includes repeating the first and second steps of the metal-rich ALD process while forming a plurality of the first and second metal-rich oxide layers, such as metal-rich oxide layers 252 and 254, contained within metal oxide bulk laminate 250.

Additionally, during step 130, the method further includes forming metal oxide buffer laminate 240 by sequentially providing the first metal source gas and a second oxidizing agent while forming a first metal-poor oxide layer, such as metal-poor oxide layer 242, during a first step of a metal-poor oxidizing ALD process, wherein metal-poor oxide layer 242 may substantially contain $MO_x$, where M is hafnium or zirconium and x is within a range from about 1.65 to about 1.95.

Subsequently, during step 130, the method further includes sequentially providing the second metal source gas and the second oxidizing agent while forming a second metal-poor oxide layer, such as metal-poor oxide layer 244, on metal-poor oxide layer 242 during a second step of the metal-poor oxidizing ALD process, wherein metal-poor oxide layer 244 may substantially contain M'O$_2$, where M' is zirconium if M is hafnium or M' is hafnium if M is zirconium. Thereafter, the method during step 130 further includes repeating the first and second steps of the metal-poor oxidizing ALD process while forming a plurality of the first and second metal-poor oxide layers, such as metal-poor oxide layers 242 and 244, contained within metal oxide buffer laminate 240.

The metal-poor oxidizing (second) ALD process includes sequentially pulsing, introducing, or otherwise providing a metal source gas and an oxidizing agent, such as ozone, into the deposition chamber and exposing the exposed surface of the processing substrate. In some examples, the metal source gas and the oxidizing agent may be sequentially pulsed, introduced, or otherwise provided during the metal-poor oxidizing (second) ALD process.

The metal-poor oxidizing (second) ALD process provides that the metal source gas may contain a tetrakis(dialkylamino) metal compound, where the metal is hafnium or zirconium and the oxidizing agent may contain ozone. In some examples, the tetrakis(dialkylamino) metal compound may be a tetrakis(dialkylamino)hafnium compound, such as tetrakis(dimethylamino)hafnium. In other examples, the tetrakis(dialkylamino) metal compound may be a tetrakis(dialkylamino) zirconium compound, such as tetrakis(dimethylamino) zirconium.

In other embodiments, the metal-rich oxidizing (first) ALD process includes sequentially pulsing, introducing, or otherwise providing a metal source gas and an oxidizing agent, wherein the oxidizing agent may be different than the oxidizing agent utilized during the metal-poor oxidizing (second) ALD process. For example, the oxidizing agent may contain or be water during the metal-rich oxidizing (first) ALD process while the oxidizing agent may contain or be ozone during the metal-poor oxidizing (second) ALD process.

Some of the materials and/or layers of metal oxide film stack 230 may be deposited or otherwise formed using a variety of deposition techniques, but in many embodiments described herein, all of the materials and/or layers of metal oxide film stack 230 may be deposited using thermal ALD processes and/or plasma-enhanced ALD (PE-ALD). In one embodiment, a metal-rich oxide material may be formed by a metal-rich oxidizing (first) ALD process utilizing water and a metal-poor oxide material may be formed by a metal-poor oxidizing (second) ALD process utilizing an activated oxygen agent, such as ozone, atomic oxygen, oxygen plasma, derivatives thereof, or combinations thereof.

The ALD processes described herein may include heating the substrate or the substrate carrier/pedestal to a deposition temperature within a range from about 50° C. to about 500° C., such as from about 200° C. to about 350° C., such as from about 250° C. to about 300° C. In one example, the deposition temperature during a metal-poor oxidizing (second) ALD process may be about 275° C. In another example, the deposition temperature during a metal-rich oxidizing (first) ALD process may be about 250° C.

In one example, a method of process 100 for forming memory device 200 on the surface of substrate 210 includes forming lower electrode 220 containing polysilicon disposed on or over substrate 210 (step 110), optionally forming silicon oxide layer 222 on or over lower electrode 220 (step 120), forming metal oxide film stack 230 on or over silicon oxide layer 222 and/or lower electrode 220 (step 130), optionally annealing the substrate, depositing upper electrode 260 on or over metal oxide film stack 230 (step 140), and optionally annealing the substrate (step 145), such as a post electrode anneal. Metal oxide film stack 230 generally contains at least one metal oxide buffer layer 234 and optionally, may contain additionally layers. In many examples, lower electrode 220 contains an n-type polysilicon material and upper electrode 260 contains titanium nitride or derivative thereof.

FIG. 2A depicts memory device 200 containing metal oxide film stack 230 disposed between at least two electrodes, such as lower electrode 220 and upper electrode 260, and lower electrode 220 is disposed or otherwise supported on substrate 210. Substrate 210 supports lower electrode 220 while depositing and forming each of the layers within memory device 200—and for subsequent manufacturing processes. Substrate 210 may be wafer or other substrate and contain silicon, doped silicon, Group III-V materials (e.g., GaAs), or derivates thereof. In most examples described herein, substrate 210 is a crystalline silicon wafer that may be doped with a dopant element. Lower electrode 220 may contain a doped silicon material, for example p-type or n-type (N+) doped polysilicon. Lower electrode 220 may be deposited or otherwise formed on or over substrate 210 during step 110.

Lower electrode 220 and upper electrode 260 may independently contain or be formed of one material or multiple materials and generally contain or formed of different conductive materials relative to each other. Numerous exemplary electrode materials that may be useful for lower electrode 220 and upper electrode 260 are provided in the written description herein. These electrode materials are only exemplary and should not be limited in scope relative to the variety of materials that may be independently contained within lower electrode 220 and upper electrode 260. In some embodiments, lower electrode 220 and upper electrode 260 have work functions that differ by an energy level within a range from about 0.1 eV to about 1 eV, such as, from about 0.4 eV to about 0.6 eV. In some examples, lower electrode 220 may contain a n-type polysilicon material which has a work function within a range from about 4.1 eV to about 4.15 eV and upper electrode 260 may contain a titanium nitride material which has a work function within a range from about 4.5 eV to about 4.6 eV. Other exemplary electrode materials that may be contained within lower electrode 220 and/or upper electrode 260 include p-type polysilicon (about 4.9 eV to about 5.3 eV), transition metals, transition metal alloys, transition metal nitrides, transition metal carbides, tungsten (about 4.5 eV to about 4.6 eV), tantalum nitride (about 4.7 eV to about 4.8 eV), molybdenum oxide (about 5.1 eV), molybdenum nitride (about 4.0 eV to about 5.0 eV), iridium (about 4.6 eV to about 5.3 eV), iridium oxide (about 4.2 eV), ruthenium (about 4.7 eV), and ruthenium oxide (about 5.0 eV). Other exemplary electrode materials for lower electrode 220 and/or upper electrode 260 include a titanium/aluminum alloy (about 4.1 eV to about 4.3 eV), nickel (about 5.0 eV), tungsten nitride (about 4.3 eV to about 5.0 eV), tungsten oxide (about 5.5 eV to about 5.7 eV), aluminum (about 4.2 eV to about 4.3 eV), copper or silicon-doped aluminum (about 4.1 eV to about 4.4 eV), copper (about 4.5 eV), hafnium carbide (about 4.8 eV to about 4.9 eV), hafnium nitride (about 4.7 eV to about 4.8 eV), niobium nitride (about 4.95 eV), tantalum carbide (about 5.1 eV), tantalum silicon nitride (about 4.4 eV), titanium (about 4.1 eV to about 4.4 eV), vanadium carbide (about 5.15 eV), vanadium nitride (about 5.15 eV), and zirconium nitride (about 4.6 eV). For some embodiments described herein, the higher work function electrode receives a positive pulse (as measured compared to a common reference potential) during a reset operation, although other materials and configurations are possible.

In other embodiments, the higher work function electrode receives a negative pulse during a reset operation. In some examples, upper electrode 260 may contain metals, metal carbides, metal oxides, or metal nitrides, which include, for example, platinum, palladium, ruthenium, ruthenium oxide, iridium, iridium oxide, titanium, titanium nitride, tungsten, tungsten oxide, tungsten nitride, tungsten carbide, tantalum, tantalum oxide, tantalum nitride, tantalum silicon nitride, tantalum carbide, molybdenum, molybdenum oxide, molybdenum nitride, titanium aluminum alloys, nickel, aluminum, doped aluminum, aluminum oxide, copper, hafnium carbide, hafnium nitride, niobium nitride, vanadium carbide, vanadium nitride, zirconium nitride, derivatives thereof, or combinations thereof. In many examples, upper electrode 260 contains titanium, titanium nitride, alloys thereof, or combinations thereof.

Memory device 200 containing upper electrode 260 deposited, formed, or otherwise disposed on or over metal oxide film stack 230 may optionally be exposed to a second annealing process, such as a post electrode anneal, during step 145 of process 100. The post electrode anneal occurs subsequent to the formation of upper electrode 260. During the post electrode anneal, memory device 200, including upper electrode 260 and metal oxide film stack 230, may be heated to an annealing temperature within a range from about 400° C. to about 1,200° C., such as from about 500° C. to about 900° C., or from about 700° C. to about 800° C., for example, about 750° C. Generally, memory device 200 may be heated for a time period within a range from about 10 seconds to about 5 minutes, such as from about 20 seconds to about 4 minutes, or from about 40 seconds to about 2 minutes during the post upper electrode anneal of step 145. The post electrode anneal may be conducted within an annealing chamber, vacuum chamber, deposition chamber, or other processing chamber that provides heat to the layers contained within memory device 200, such as metal oxide film stack 230 and upper electrode 260.

In some examples, memory device 200 containing upper electrode 260 may be heated to an annealing temperature within a range from about 700° C. to about 800° C. for a time period within a range from about 40 seconds to about 2 minutes during the post upper electrode anneal at step 145. In one example, the annealing temperature of about 750° C. for about 1 minute is used during the annealing process.

Figure 3:
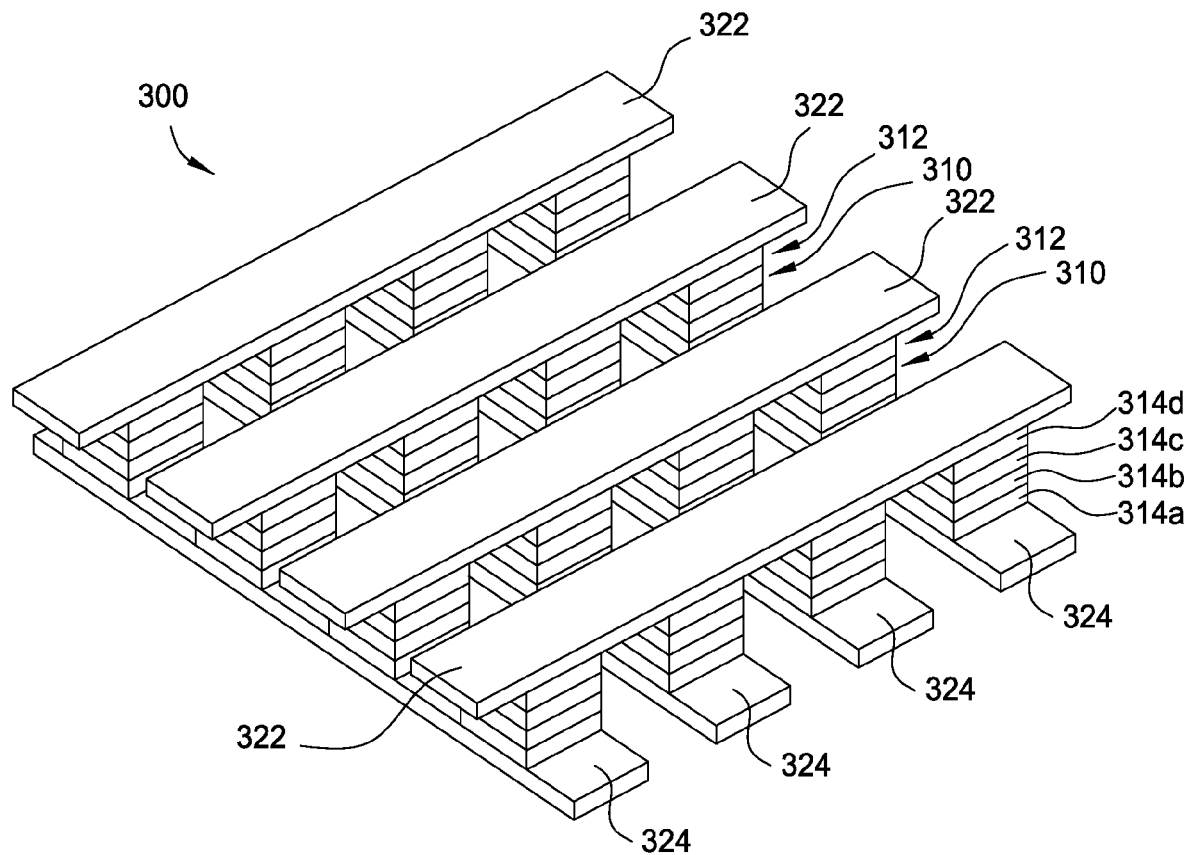
FIG. 3 depicts a memory array of resistive switching memory devices, as described by another embodiment herein.

FIG. 3 depicts a memory array 300 of resistive switching memory devices 310, as described by embodiments herein. Each memory device 310 contains at least one switching memory element 312, and may contain multiple switching memory elements 312. In some embodiments, memory devices 310 may be a plurality of memory devices 200, depicted in FIG. 2A. Each memory device 200 may independently contain any of the metal oxide film stacks 230 illustrated in FIGS. 2B-2E. Memory array 300 may be part of a larger memory device or other integrated circuit structure, such as a system on a chip type device. Read and write circuitry is connected to switching memory devices 310 using electrodes 322 and electrodes 324. Electrodes, such as upper electrodes 322 and lower electrodes 324, are sometimes referred to as word lines and bit lines, and are used to read and write data into the memory elements 312 in the switching memory devices 310. Individual switching memory devices 310 or groups of switching memory devices 310 can be addressed using appropriate sets of electrodes 322 and 324. The memory elements 312 in the switching memory devices 310 may be formed from a plurality of layers 314a, 314b, 314c, and 314d containing various materials, as indicated schematically in FIG. 3. In addition, memory arrays such as memory array 300 can be stacked in a vertical fashion to make multilayer memory array structures.

According to various embodiments described herein, resistive-switching memory elements/devices generally have a structure in which resistive-switching insulating layers are surrounded by two conductive electrodes. In some embodiments, memory elements may have electrodes of different materials (e.g., one electrode containing a doped silicon material and the other electrode containing a titanium nitride material) surrounding a resistive-switching layer of a metal oxide (e.g., hafnium oxide) having a thickness within a range from about 20 Å to about 100 Å, and a coupling layer that is substantially thinner than the resistive-switching layer (e.g., less than 25% the thickness of the resistive-switching layer). In some embodiments, the coupling layer may be a metallic material such as titanium. Memory elements including the coupling layer have exhibited improved switching characteristics (e.g., lower set, reset, and forming voltages, and better retention). In some embodiments, the resistive-switching layer includes a higher bandgap material (e.g., a material having a bandgap greater than 4 eV such as hafnium oxide, aluminum oxide, tantalum oxide, yttrium oxide, zirconium oxide, cerium oxide, alloys thereof, derivatives thereof, or combinations thereof), however other resistive-switching layers may include materials having a bandgap less than 4 eV (e.g., titanium oxide).

ALD Processes

The exemplary ALD processes for depositing or otherwise forming the metal oxide materials contained within metal oxide film stack 230 and other materials and/or layers contained within memory device 200 are typically conducted in a deposition chamber, such as an ALD chamber. The deposition chamber may maintain an internal pressure of less than 760 Torr, such as within the range from about 10 mTorr to about 10 Torr, such as from about 100 mTorr to about 1 Torr, for example, about 350 mTorr. The temperature of the substrate or the substrate carrier/pedestal is usually maintained within the range from about 50° C. to about 1,000° C., such as from about 100° C. to about 500° C., such as from about 200° C. to about 400° C., or such as from about 250° C. to about 300° C.

The metal source gas may be pulsed, introduced, or otherwise provided into the deposition chamber at a flow rate within the range from about 0.1 sccm to about 200 sccm, such as from about 0.5 sccm to about 50 sccm, from about 1 sccm to about 30 sccm, for example, about 10 sccm. The metal source gas may be provided along with a carrier gas, such as argon or nitrogen. The carrier gas may have a flow rate within the range from about 1 sccm to about 300 sccm, such as from about 2 sccm to about 80 sccm, from about 5 sccm to about 40 sccm, for example, about 20 sccm.

The metal source gas may be pulsed or otherwise provided into the deposition chamber at a rate within a range from about 0.01 seconds to about 10 seconds, depending on the particular process conditions, metal source gas or desired composition of the deposited metal oxide material. In one embodiment, such as for forming a metal-poor oxide material, the metal source gas may be pulsed, introduced, or otherwise provided into the deposition chamber at a rate within a range from about 1 second to about 10 seconds, such as from about 1 second to about 5 seconds, for example, about 3 seconds. In another embodiment, such as for forming a metal-rich oxide material, the metal source gas may be pulsed, introduced, or otherwise provided into the deposition chamber at a rate within a range from about 0.05 seconds to about 2 seconds, such as from about 0.1 seconds to about 1 second, for example, about 0.5 seconds. In many examples, the metal source gas is a hafnium precursor which is a tetrakis(dialkylamino)hafnium compound, such as tetrakis(dimethylamino) hafnium (($Me_2N$)$_4$Hf or TDMAH), tetrakis(diethylamino) hafnium (($Et_2N$)$_4$Hf or TDEAH), or tetrakis (ethylmethylamino)hafnium ((EtMeN)$_4$Hf or TEMAH).

The metal source gas is generally dispensed into a deposition chamber by introducing a carrier gas through an ampoule containing the metal source or precursor. An ampoule unit may include an ampoule, a bubbler, a canister, a cartridge, or other container used for storing, containing, or dispersing chemical precursors. In another example, the ampoule may contain a liquid precursor (e.g., TDMAH or TDEAH) and be part of a liquid delivery system containing injector valve system used to vaporize the liquid precursor with a heated carrier gas. Generally, the ampoule may be heated to a temperature of about 100° C. or less, such as within a range from about 30° C. to about 90° C., for example, about 50° C.

The oxidizing agent (e.g., $O_2$, $O_3$, $H_2O$) may be pulsed, introduced, or otherwise provided into the deposition chamber at a flow rate within a range from about 0.01 seconds to about 10 seconds, depending on the particular process conditions, oxygen source gas or oxidizing agent or desired composition of the deposited metal oxide material. In one embodiment, such as for forming a metal-poor oxide material, the oxidizing agent may be pulsed, introduced, or otherwise provided into the deposition chamber at a rate within a range from about 0.001 seconds to about 1 second, such as from about 0.001 seconds to about 0.1 seconds, for example, about 0.05 seconds. In another embodiment, such as for forming a metal-rich oxide material, the oxidizing agent may be pulsed, introduced, or otherwise provided into the deposition chamber at a rate within a range from about 0.5 second to about 10 seconds, such as from about 1 second to about 3 seconds, for example, about 2 seconds.

The oxidizing agent may contain or be formed of or generated from an oxygen source that includes oxygen ($O_2$), atomic oxygen (O), ozone ($O_3$), nitrous oxide ($N_2O$), nitric oxide (NO), nitrogen dioxide ($NO_2$), dinitrogen pentoxide ($N_2O_5$), hydrogen peroxide ($H_2O_2$), derivatives thereof, plasmas thereof, or combinations thereof. Ozone may be formed inside or outside of the deposition chamber, such as the ALD chamber. In one example, the oxidizing agent contains ozone formed by an ozone generator positioned outside of the interior of the deposition chamber. Ozone is generated and then flowed or directed into the deposition chamber and exposed along with the metal source gas to the substrate surface. In another example, the oxidizing agent contains ozone formed by a plasma generated within the interior of the deposition chamber. Oxygen gas flowed or directed into the deposition chamber, then ignited or formed into ozone and/or atomic oxygen before being sequentially exposed along with the metal source gas to the substrate surface.

A carrier gas or a purge gas may be provided at the same time as the metal source gas and/or the oxygen source, but is also provided between the pulses of the metal source gas and/or the oxygen source. The carrier gas or purge gas may continuous flow during the ALD process or may be intermediately and/or sequentially pulsed, introduced, or otherwise provided during the ALD. The carrier gas or purge gas may be pulsed, introduced, or otherwise provided into the deposition chamber at a rate within a range from about 1 second to about 30 seconds, depending on the particular process conditions, source gases, or desired composition of the deposited metal oxide material. In one embodiment, the carrier gas or a purge gas may be pulsed, introduced, or otherwise provided into the deposition chamber at a rate within a range from about 1 second to about 30 seconds, such as from about 2 seconds to about 20 seconds, for example, about 10 seconds or about 15 seconds.

The carrier gas or purge gas may contain nitrogen, argon, helium, hydrogen, a forming gas, oxygen, mixtures thereof, or combinations thereof. The carrier gas or the purge gas may be sequentially pulsed, introduced, or otherwise provided after each pulse of the metal source gas and each pulse of the oxidizing agent during the ALD cycle. The pulses of purge gas or carrier gas are typically pulsed, introduced, or otherwise provided at a flow rate within a range from about 2 standard liters per minute (slm) to about 22 slm, such as about 10 slm. The specific purge gas flow rates and duration of process cycles are obtained through experimentation. In one example, a 300 mm diameter wafer requires about twice the flow rate for the same duration as a 200 mm diameter wafer in order to maintain similar throughput.

Many precursors are within the scope of embodiments of the invention for depositing the dielectric materials described herein. One important precursor property is to have a favorable vapor pressure. Precursors at ambient temperature and pressure may be gas, liquid, or solid. However, volatilized precursors are used within the ALD chamber. Organic-metallic compounds contain at least one metal atom and at least one organic-containing functional group, such as amides, alkyls, alkoxyls, alkylaminos, anilides, or derivatives thereof. Precursors may include organic-metallic, organometallic, inorganic, or halide compounds.

In one embodiment, the metal source gas is formed from or contains a tetrakis(dialkylamino) metal compound, such as a tetrakis(dialkylamino)hafnium compound or a tetrakis(dialkylamino)zirconium compound. Tetrakis(dialkylamino) metal compounds are useful for depositing metal oxides contained within metal oxide film stack 230 and other materials and/or layers within memory device 200 during ALD processes.

In some examples, the metal source gas contains or is formed from exemplary hafnium precursors which include hafnium compounds containing ligands such as halides, alkylaminos, cyclopentadienyls, alkyls, alkoxides, derivatives thereof, or combinations thereof. Hafnium alkylamino compounds useful as hafnium precursors include tetrakis(dialkylamino)hafnium compounds, such as (RR'N)$_4$Hf, where R or R' are independently hydrogen, methyl, ethyl, propyl, or butyl. Hafnium halide compounds useful as hafnium precursors may include $HfCl_4$, $HfI_4$, and $HfBr_4$. Exemplary hafnium precursors useful for depositing hafnium oxides and other hafnium-containing materials contained within metal oxide film stack 230 and other materials and/or layers within memory device 200 during ALD processes include ($Et_2N$)$_4$Hf, ($Me_2N$)$_4$Hf, (MeEtN)$_4$Hf, ($^tBuC_5H_4$)$_2$HfCl$_2$, ($C_5H_5$)$_2$HfCl$_2$, (Et$C_5H_4$)$_2$HfCl$_2$, ($Me_5C_5$)$_2$HfCl$_2$, ($Me_5C_5$)HfCl$_3$, ($^iPrC_5H_4$)$_2$HfCl$_2$, ($^iPrC_5H_4$)HfCl$_3$, ($^tBuC_5H_4$)$_2$HfMe$_2$, (acac)$_4$Hf, (hfac)$_4$Hf, (tfac)$_4$Hf, (thd)$_4$Hf, ($NO_3$)$_4$Hf, ($^tBuO$)$_4$Hf, ($^iPrO$)$_4$Hf, (EtO)$_4$Hf, (MeO)$_4$Hf, or derivatives thereof.

In other examples, the metal source gas contains or is formed from exemplary zirconium precursors which include zirconium compounds containing ligands such as halides, alkylaminos, cyclopentadienyls, alkyls, alkoxides, derivatives thereof, or combinations thereof. Zirconium alkylamino compounds useful as zirconium precursors include tetrakis (dialkylamino)zirconium compounds, such as (RR'N)$_4$Zr, where R or R' are independently hydrogen, methyl, ethyl, propyl, or butyl. Zirconium halide compounds useful as zirconium precursors may include $ZrCl_4$, $ZrI_4$, and $ZrBr_4$.

Exemplary zirconium precursors useful for depositing zirconium oxides and other zirconium-containing materials contained within metal oxide film stack 230 and other materials and/or layers within memory device 200 during ALD processes include $(Et_2N)_4Zr$, $(Me_2N)_4Zr$, $(MeEtN)_4Zr$, $(^tBuC_5H_4)_2ZrCl_2$, $(C_5H_5)_2ZrCl_2$, $(EtC_5H_4)_2ZrCl_2$, $(Me_5C_5)_2ZrCl_2$, $(Me_5C_5)ZrCl_3$, $(^iPrC_5H_4)_2ZrCl_2$, $(^iPrC_5H_4)ZrCl_3$, $(^tBuC_5H_4)_2ZrMe_2$, $(acac)_4Zr$, $(hfac)_4Zr$, $(tfac)_4Zr$, $(thd)_4Zr$, $(NO_3)_4Zr$, $(^tBuO)_4Zr$, $(^iPrO)_4Zr$, $(EtO)_4Zr$, $(MeO)_4Zr$, or derivatives thereof.

The ALD processes, as disclosed herein by the written description, are provided as exemplary ALD processes and should not be limited in scope relative to the variety of ALD processes that may be useful for depositing or otherwise forming the metal oxide materials contained within metal oxide film stack 230 and other materials and/or layers contained within memory device 200. Chemical precursors, carrier gases, pulse times, exposure times, flow rates, temperatures, pressures, sequence orders, and other variables may be adjusted accordingly in order to form the desired thickness and stoichiometry of the metal oxide materials contained within metal oxide film stack 230 and other materials and/or layers contained within memory device 200.

"Atomic layer deposition" as used herein refers to the sequential introduction of two or more reactive compounds to deposit a layer of material on a substrate surface. The two, three or more reactive compounds may alternatively be introduced into a reaction zone of a deposition chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as argon or nitrogen, may be pulsed or otherwise provided into the deposition chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the deposition chamber employed, the vacuum system coupled thereto, and the volatility/reactivity of the particular compound itself. A "half-reaction" as used herein is intended to refer to a pulse of precursor step followed by a purge step.

While the foregoing is directed to embodiments of the invention, other and further embodiments of the invention may be devised without departing from the basic scope thereof, and the scope thereof is determined by the claims that follow.

The invention claimed is:

1. A method for fabricating a resistive switching memory element, the method comprising:
forming a metal oxide film stack over a lower electrode disposed on a substrate,
wherein the metal oxide film stack comprises a metal oxide buffer layer disposed over a metal oxide bulk layer, and the metal oxide film stack is formed by:
depositing the metal oxide bulk layer over the lower electrode during a first atomic layer deposition process,
wherein the metal oxide bulk layer substantially comprises $MO_x$, where M is hafnium or zirconium and x is within a range from about 1.65 to about 1.95; and
depositing the metal oxide buffer layer over the metal oxide bulk layer during a second atomic layer deposition process,
wherein the metal oxide buffer layer substantially comprises $M'O_2$, where M' is zirconium if M is hafnium or M' is hafnium if M is zirconium.

2. The method of claim 1, wherein the metal oxide bulk layer substantially comprises $HfO_x$, where x is within a range from about 1.70 to about 1.90 and the metal oxide buffer layer substantially comprises $ZrO_2$.

3. The method of claim 2, wherein the metal oxide bulk layer has a thickness within a range from about 15 A to about 50 A and the metal oxide buffer layer has a thickness within a range from about 5 A to about 15 A.

4. The method of claim 1, wherein the metal oxide bulk layer substantially comprises $ZrO_x$, where x is within a range from about 1.70 to about 1.90 and the metal oxide buffer layer substantially comprises $HfO_2$.

5. The method of claim 4, wherein the metal oxide bulk layer has a thickness within a range from about 15 A to about 50 A and the metal oxide buffer layer has a thickness within a range from about 5 A to about 15 A.

6. The method of claim 1, wherein the first atomic layer deposition process comprises sequentially providing a metal source gas and an oxidizing agent during a metal-rich oxidizing Atomic Layer Deposition (ALD) process,
the metal source gas comprises a tetrakis(dialkylamido) hafnium compound,
the oxidizing agent comprises water, and
the substrate is maintained at a deposition temperature within a range from greater than 0° C. to about 15° during the metal-rich oxidizing ALD process.

7. The method of claim 1, wherein the first atomic layer deposition process comprises sequentially providing a metal source gas and an oxidizing agent during a metal-rich oxidizing ALD process, the metal source gas comprises a tetrakis (dialkylamido) zirconium compound, and the oxidizing agent comprises water during the metal-rich oxidizing ALD process.

8. The method of claim 7, wherein the second atomic layer deposition process comprises sequentially providing a metal source gas and an oxidizing agent during a metal-poor oxidizing ALD process, the metal source gas comprises a tetrakis (dialkylamido) zirconium compound, and the oxidizing agent comprises an activated oxygen agent selected from the group consisting of ozone, atomic oxygen, oxygen plasma, derivatives thereof, and combinations thereof during the metal-poor oxidizing ALD process.

9. The method of claim 7, wherein the second atomic layer deposition process comprises sequentially providing a metal source gas and an oxidizing agent during a metal-poor oxidizing ALD process, the metal source gas comprises a tetrakis (dialkylamido) hafnium compound, and the oxidizing agent comprises an activated oxygen agent selected from the group consisting of ozone, atomic oxygen, oxygen plasma, derivatives thereof, and combinations thereof during the metal-poor oxidizing ALD process.

10. The method of claim 1, further comprising forming a silicon oxide layer over the lower electrode, and subsequently, forming the metal oxide bulk layer over the silicon oxide layer, wherein the silicon oxide layer comprises native silicon oxides or silicon dioxide and the silicon oxide layer has a thickness within a range from about 2 A to about 20 A.

11. A method for fabricating a resistive switching memory element, the method comprising:
forming a metal oxide film stack over a lower electrode disposed on a substrate,
wherein the metal oxide film stack comprises a doped-metal oxide buffer layer disposed over a metal oxide bulk layer, and the metal oxide film stack is formed by:
depositing the metal oxide bulk layer over the lower electrode during a first atomic layer deposition process, wherein the metal oxide bulk layer substantially comprises MOx, where M is hafnium or zirconium and x is within a range from about 1.65 to about 1.95; and
depositing the doped-metal oxide buffer layer over the metal oxide bulk layer during a second atomic layer deposition process,
wherein the doped-metal oxide buffer layer substantially comprises MM'O$_4$ or a mixture of MO$_2$ and M'O$_2$, where M is the same metal selected for the metal oxide bulk layer, M' is zirconium if M is hafnium or M' is hafnium if M is zirconium.

12. The method of claim 11, wherein the doped-metal oxide buffer layer substantially comprises a mixture of MO$_2$ and M'O$_2$,
wherein M is hafnium and M' is zirconium and the doped-metal oxide buffer layer comprises zirconium oxide at a concentration within a range from about 1 at % to about 15 at % and hafnium oxide at a concentration within a range from about 85 at % to about 99 at %.

13. The method of claim 11, wherein the doped-metal oxide buffer layer substantially comprises a mixture of MO$_2$ and M' O$_2$, wherein M is zirconium and M' is hafnium and the doped-metal oxide buffer layer comprises hafnium oxide at a concentration within a range from about 1 at % to about 15 at % and zirconium oxide at a concentration within a range from about 85 at % to about 99 at %.

14. The method of claim 11, wherein the second atomic layer deposition process further comprises:
sequentially providing a first metal source gas and an oxidizing agent while forming a metal-poor oxide layer during a deposition step of a metal-poor oxidizing ALD process; and
subsequently doping the metal-poor oxide layer while forming the doped-metal oxide buffer layer during a doping step of the metal-poor oxidizing ALD process, and repeating the deposition and doping steps of the metal-poor oxidizing ALD process while forming the doped-metal oxide buffer layer.

15. The method of claim 11, wherein the second atomic layer deposition process further comprises:
sequentially providing a first metal source gas and an oxidizing agent while forming a metal-poor oxide layer during a deposition step of a metal-poor oxidizing ALD process; and subsequently
doping the metal-poor oxide layer while forming the doped-metal oxide buffer layer during a doping step of the metal-poor oxidizing ALD process, wherein the metal-poor oxide layer is exposed to a second metal source gas and the oxidizing agent during the doping step of the metal-poor oxidizing ALD process.

16. A method for fabricating a resistive switching memory element, the method comprising:
forming a metal oxide film stack over a lower electrode disposed on a substrate, wherein the metal oxide film stack comprises a metal oxide buffer laminate disposed over a metal oxide bulk layer, and the metal oxide film stack is formed by:
depositing the metal oxide bulk layer over the lower electrode during a first atomic layer deposition process, wherein the metal oxide bulk layer substantially comprises MOx, where M is hafnium or zirconium and x is within a range from about 1.65 to about 1.95; and
depositing the metal oxide buffer laminate over the metal oxide bulk layer during a second atomic layer deposition process, wherein the metal oxide buffer laminate substantially comprises a plurality metal-poor oxide layers of MO2 and M'O2, where M is the same metal selected for the metal oxide bulk layer, M' is zirconium if M is hafnium or M' is hafnium if M is zirconium.

17. The method of claim 16, wherein the second atomic layer deposition process further comprises:
sequentially providing a first metal source gas and an oxidizing agent while forming a first metal-poor oxide layer during a first step of a metal-poor oxidizing ALD process; and subsequently
sequentially providing a second metal source gas and the oxidizing agent while forming a second metal-poor oxide layer on the first metal-poor layer during a second step of the metal-poor oxidizing ALD process; and
repeating the first and second steps of the metal-poor oxidizing ALD process while forming a plurality of first and second metal-poor oxide layers contained within the metal oxide buffer laminate.

18. The method of claim 17, wherein each of the first and second metal source gases independently comprises an organic-metallic compound and the oxidizing agent comprises an activated oxygen agent selected from the group consisting of ozone, atomic oxygen, oxygen plasma, derivatives thereof, and combinations thereof.

19. The method of claim 16, wherein the metal oxide buffer laminate has a thickness within a range from about 5 A to about 30 A, the metal oxide bulk layer has a thickness within a range from about 15 A to about 50 A, and each of the metal-poor oxide layers independently have a thickness within a range from about 2 A to about 10 A.

20. A method for fabricating a resistive switching memory element, the method comprising:
forming a metal oxide film stack over a lower electrode disposed on a substrate, wherein the metal oxide film stack comprises a metal oxide buffer laminate disposed over a metal oxide bulk laminate;
wherein forming the metal oxide bulk laminate comprises:
sequentially providing a first metal source gas and a first oxidizing agent while forming a first metal-rich oxide layer during a first step of a metal-rich oxidizing ALD process, wherein the first metal-rich oxide layer substantially comprises MOx, where M is hafnium or zirconium and x is within a range from about 1.65 to about 1.95; and subsequently
sequentially providing a second metal source gas and the first oxidizing agent while forming a second metal-rich oxide layer on the first metal-rich oxide layer during a second step of the metal-rich oxidizing ALD process, wherein the second metal-rich oxide layer substantially comprises M'O$_2$, where M' is zirconium if M is hafnium or M' is hafnium if M is zirconium; and repeating the first and second steps of the metal-rich ALD process while forming a plurality of the first and second metal-rich oxide layers contained within the metal oxide bulk laminate; and wherein forming the metal oxide buffer laminate comprises:

sequentially providing the first metal source gas and a second oxidizing agent while forming a first metal-poor oxide layer during a first step of a metal-poor oxidizing ALD process, wherein the first metal-poor oxide layer substantially comprises MOx, where M is hafnium or zirconium and x is within a range from about 1.65 to about 1.95; and subsequently sequentially providing the second metal source gas and the second oxidizing agent while forming a second metal-poor oxide layer on the first metal-poor oxide layer during a second step of the metal-poor oxidizing ALD process, wherein the second metal-poor oxide layer substantially comprises M'O$_2$, where M' is zirconium if M is hafnium or M' is hafnium if M is zirconium; and repeating the first and second steps of the metal-poor oxidizing ALD process while forming a plurality of the first and second metal-poor oxide layers contained within the metal oxide buffer laminate.

\* \* \* \* \*